(12) United States Patent
Potter

(10) Patent No.: US 7,576,427 B2
(45) Date of Patent: Aug. 18, 2009

(54) COLD WELD HERMETIC MEMS PACKAGE AND METHOD OF MANUFACTURE

(75) Inventor: Curtis Nathan Potter, Austin, TX (US)

(73) Assignee: Stellar Micro Devices, Austin, TX (US)

( * ) Notice: Subject to any disclaimer, the term of this patent is extended or adjusted under 35 U.S.C. 154(b) by 359 days.

(21) Appl. No.: 11/139,960

(22) Filed: May 27, 2005

(65) Prior Publication Data

US 2005/0263878 A1  Dec. 1, 2005

Related U.S. Application Data

(60) Provisional application No. 60/574,835, filed on May 28, 2004.

(51) Int. Cl.
*H01L 23/10* (2006.01)

(52) U.S. Cl. .................. 257/710; 438/106; 257/704

(58) Field of Classification Search ................ 438/115, 438/121, 125, 106, 421; 257/704, 710, 729
See application file for complete search history.

(56) References Cited

U.S. PATENT DOCUMENTS

| 4,145,627 | A  | * | 3/1979 | Ishizawa ..................... 310/344 |
| 6,413,800 | B1 | * | 7/2002 | Kyle .......................... 438/115 |
| 6,429,511 | B2 | * | 8/2002 | Ruby et al. ................. 257/704 |

* cited by examiner

*Primary Examiner*—S. V Clark

(57) ABSTRACT

A cold welded hermetic micro or nano package sealed in an inert atmosphere with optional force maintenance means for ensuring permanent closure. A package cap 410 coated with precursor weld material is sealed to a package base 405 containing integral device 445 then cold welded with an external force mechanism to compress and flow cold seal preform material 435 creating a hermetic peripheral seal in an inert or vacuum atmosphere. Arrays of devices can be sealed with individual caps or arrays of caps which are interconnected.

10 Claims, 7 Drawing Sheets

COLD WELD HERMETIC MEMS PACKAGE AND METHOD OF MANUFACTURE

CROSS REFERENCE TO RELATED APPLICATION

This application claims benefit of U.S. Provisional Patent Application No. 60/574,835 filed May 28, 2004 and Disclosure Document No. 542148 filed Nov. 17, 2003. Subject matter set forth in Provisional Patent Application 60/574,835 and Disclosure Document No. 542148 is hereby incorporated by reference into the present application as if fully set forth therein.

STATEMENT REGARDING FEDERALLY FUNDED RESEARCH AND DEVELOPMENT

This invention was supported in part by U.S. National Science Foundation grant DMI-0512857

BACKGROUND OF THE INVENTION

This invention relates generally to the hermetic packaging of microdevices including semiconductor devices, hybrid devices, vacuum microelectronic devices and Micro Electro Mechanical System (MEMS) devices. The substance of the invention is the use of a high aspect ratio solder perform and an optional mechanical design structure to enhance the surface flow of the solder preform and compression bonding with enough force to create a hermetic cold weld in order to seal a cap and base for the microdevice in a vacuum or a rarefied atmosphere and at room temperature. The cold weld bond is sufficient to ensure adequate hermeticity during the operational lifetime of the device. The resulting yield strength of the cold weld bond is sufficient so as to avoid any other force retention devices.

Hermetic microdevice packages enjoy wide use in the semiconductor industry in applications where true hermeticity is required. Such hermeticity is required where ambient conditions outside of the package or variations in the ambient conditions might affect device performance. In the semiconductor industry, hermetic passivation layers have been developed and applied to the surfaces of sensitive devices in order to give a primary level of defense against ambient conditions. Some of these layers are adequately hermetic. In other instances, a hermetic package is required.

While there exists numerous examples of cold weld feasibility and hermeticity at the macroscopic scale as cited in this disclosure, a quantitative physical model is more elusive due to the complexity of the bond process. Material deformation is a key element for successful cold welding. It is normally characterized by a surface expansion at the interface of each material to be cold welded. N. Bay, Weld Journal, Vol 62, 1983, p. 137, developed a bond strength model based on surface area expansion at the bonding interface and the bonding force normal to the interface. The model relies on the fracturing of a surface interface layer by material shear flow followed by sufficient force normal to the welding interface to force intimate atomic contact between the two members to be bonded. The ratio of bond strength of the stronger member to the yield stress of the weaker member is claimed to be proportional to the extrusion of metal through cracks in the surface layer plus the degree of surface area expansion that will provide the surface layer cracking.

The bond strength model proposed by Bay takes the form of a bond-strength/yield-stress ratio equated to a surface expansion, pressure, yield stress function as follows:

$$\frac{\emptyset_b}{\emptyset_o} = (1-\beta)Y\frac{p-p_E}{\emptyset_o} + \beta\frac{Y-Y'}{1-Y'}\frac{p}{\emptyset_o}$$

$\emptyset_b$ Bond strength $\emptyset_o$ Yield stress $\beta$ Area if surface

Y Surface expansion

Y' Surface expansion at fracture p Normal pressure $p_E$ Extrusion pressure

Testing of this relationship has shown satisfactory correlation, (N. Bay, Trans. ASME Jour. Engn. Ind., Vol. 101, 1979), for aluminum to aluminum bonding over the surface expansion range of fractional millimeters.

An important distinction can be made between macroscopic and microscopic shear phenomena. Such distinction can call into question the validity of Bays' relationship for rough surfaces. In cases where there are microscopic asperities in the surfaces to be welded the surface expansion needed to cause welding of the asperities may be very much reduced. Thus there is an issue of how linear the relationship between $p-P_E$ and Y-Y' remains as a function of asperity size and density.

The relationship claimed by Bay identifies some of the key material properties that optimize bond strength and, by extension, vacuum hermeticity. It is clearly advantageous to maximize surface expansion and minimize surface interface layers that can interfere with intimate contact between the two members to be bonded. The bonding pressure normal to the welding surfaces should be maximized within the constraint of the yield strength of the materials to be bonded.

A common hermetic package consists of a package base with electrical feedthrus insulated from such base for the purpose of extracting electrical signals from the device inside the package. The sensitive active device is mounted on the package base and microwire bonds are made to connect the device output pads to the package base electrical feedthrus. Finally a cover or cap is attached to the base via a hermetic bonding technique which varies according to the package material and its preparation. Prior-art bonding techniques require some degree of heat application to insure a hermetic bond of cap to base.

The two most common techniques for hermetically bonding cap to base are cap welding and solder sealing. Cap welding is accomplished by passing a high weld current through a tip (often a small roller) which precesses around the rim of the cap/package assembly as it locally melts the two metal members together. The solder sealing technique utilizes a solder preform (commonly gold/tin eutectic solder) placed between a gold plated cap and base, followed by the application of a heated ring at nominally 320° C. to melt the solder and effect the hermetic seal. Both of these techniques result in a considerable amount of heat transmitted through the package base and to the active device. Although there are methods of reducing the amount of heat transfer to the active device, it is not possible to eliminate the device heating altogether.

MEMS devices which exhibit free-standing micro mechanical structures have been hermetically packaged using both cap welding and solder sealing. However, due to residual stress in free standing members and the extreme sensitivity of structure surfaces, heat can either totally destroy or drastically reduce the production yields of such MEMS devices, especially the more complex types. For such devices, a room temperature package sealing process would be of great benefit.

Room temperature hermetic sealing has been utilized in Ultra High Vacuum (UHV) equipment technology for a number of years and is pervasive in the art of that technology. U.S. Pat. No. 3,208,758, Carlson and Wheeler, describes a vacuum seal technique suitable for high temperature baking after a room temperature seal has been implemented. The patent is focused on large flanges used in UHV vacuum system assembly. A copper gasket seal is described wherein two mating vacuum parts structured with vertical and sloping cutting edges are swaged into the copper gasket to effect a vacuum seal. The high force required for the deformation of the copper is achieved by tightening a series of bolts and nuts around the periphery of a flange. A preferred shape of the cutting edge is disclosed although the force required to effect a vacuum tight seal is not disclosed. The assembly, including the copper gasket and cutting edge shape, has come to be known as a "conflat" type vacuum fitting and is in wide use in the vacuum equipment industry. It has not been applied to microdevice packaging. Additional embodiments of the basic "conflat" sealing technique can be found in U.S. Pat. Nos. 3,217,992, Glasgow, and 3,368,818, Asamaki, et. al., both describing alternative bolting attachment geometries to effect the metal seal. Neither patent addresses the possibility of applying the technique to seal MEMS or microdevice packages.

Macro-scale cold welding has also been used for many years. Cold weld sealing has been exploited for cryogenic applications, such as focal plane array device sealing and input/output signal connections, as is described in A. M. Fowler et. al., "Orion: The Largest Infrared Focal Plane Array in Production", National Optical Astronomy Observatory, NOAO Preprint Series, No 903. Cold welds may be made with materials having various tensile strengths. While low tensile strength materials require less pressure for the formation of the weld, they are more susceptible to deformation caused, for example, by later elevated temperature excursions. High tensile strength materials require higher pressures for the cold weld, but are less susceptible to later deformations. Once a weld is made with a moderate tensile strength material such as copper, the bond provides a yield strength close to the yield strength of the materials used.

Indium (melting point, MP=156° C.) has been used extensively as a cold weld material in cold temperature electronics, as is described in "NASA Technical Brief, Lewis Research Center Cleveland Ohio, June 1998". Indium cold weld bumps are used for cold electronics chip input-output connections. The pressures required for forming hermetic bonds are much lower than the yield strength of single crystal silicon. Due to its' low melting point, however, indium is limited in the degree of post bond temperature cycling that can be tolerated. While vacuum hermetic seals have been demonstrated using indium, the resulting yield strength of the sealed parts is low due to the low yield strength of indium (on order of 1000 PSI). Kyle, U.S. Pat. No. 6,413,800 utilizes indium as a cold weld sealant for micropackages but due to the low yield strength of indium he requires an epoxy sealant as an adjunct for a force retention means.

Cold welding of medium tensile strength materials such as copper, aluminum and gold has been employed for considerable time. So-called "butt" cold welding is used to join heavy wire and rod material (see "Dave Nichols, The Welding Institute, TWI website, "Cold Pressure Welding"). This technique applies much higher pressure than for solder systems and relies on substantial flow of the material at the butt ends—that is a lateral flow of up to 2 to 3 times the rod diameter while containing the circumference of the rod. Hand-operated cold welding tools (see for example "Huestis Industrial Corporation, Cold Pressure Welding Tools. 2002") are designed and used to cold weld nonferrous materials in the 0.08 to 1.20 mm range. While the cold welding of materials such as copper and aluminum is established art in these kinds of macro-scale applications, it has not been utilized in a MEMS or semiconductor micropackage. Furthermore, the pressures required are much higher than the yield strength of silicon, though they may be closer to the yield strength of some ceramics used as MEMS substrates.

With recent advances in MEMS technology leading to more sophisticated devices, efforts are being made to develop suitable packaging technology, both for single MEMS die and packaging at the wafer level. For MEMS devices, packaging at the wafer level is particularly attractive due to the way they are fabricated. Virtually all MEMS devices comprise micro mechanical elements suspended in space. During the fabrication process, these elements must be supported by a sacrificial material, usually through several levels of processing until the end of the fabrication sequence. At the end of the sequence, the sacrificial material is removed, commonly by etching, leaving the micro mechanical members preserved in their design space. This step is known as the "release" process. It is clearly desirable from a cost point of view to perform this release process on a whole wafer rather than individual die. However, once release is performed, the MEMS devices cannot be singulated without the individual mechanical parts being damaged from singulation debris or becoming stuck together (called stiction). The die are also extremely sensitive to contamination during storage and any processing after release but before packaging. Interest has therefore grown in performing release and hermetic packaging at the wafer scale prior to die singulation.

Recent development work in MEMS packaging at the wafer scale has focused on bonding directly to the silicon or other substrate used to fabricate the MEMS. This includes anodic or fusion bonding using heat and high electric fields, eutectic bonding using heat to form a bond between gold or aluminum to silicon, and thermocompression bonding. A novel application of heat has been explored using a polysilicon resistance heater element embedded directly into the MEMS devices.

In U.S. Pat. No. 6,379,988 B1, Petersen and Conley describe a pre-release plastic packaging of MEMS devices wherein the device is encapsulated in a plastic package prior to release. The plastic package can be perforated to allow release in the package using wet or dry etching processes. In a final step, a cover lid is attached to the plastic package by various means common in prior art.

U.S. Pat. No. 6,400,009 B1, Bishop, et. al., discloses a MEMS package and bonding means employing a firewall to form a protective cavity for the MEMS device during heat sealing of top and bottom members of the package. Electrical feedthrus that penetrate the firewall may be made of polysilicon conductive material encapsulated with silicon dioxide. All structures disclosed are fabricated concurrently with the MEMS device. An integral plurality of solder bumps is claimed as a means of strengthening the solder bonded parts. The sealing means described is heated solder sealing.

U.S. Pat. No. 6,627,814B1, David H. Stark, discloses a package with a continuous sidewall with a top surface prepared for solder sealing. A transparent window forms a top cover. The window is prepared with an outer metallic frame suitable for soldering to the base. The solder method requires the application of heat above the melting temperature of the solder. P U.S. Pat. No. 6,639,313 B1, Martin and Harney, discloses a ceramic package with a recess for holding an optical MEMS mirror device. A glass window cover is disclosed which is heat solder-sealed to the ceramic substrate by means of a flexible, folded metal interposer disposed peripherally around the edge of the glass window and ceramic base. Uniquely, the folded metal interposer allows the difference in expansion and contraction between the window and the ceramic to be mitigated during heat cycling. Hermeticity is achieved by heat soldering.

U.S. Pat. No. 6,413,800, Kyle, teaches a cold weld hermetic packaging method in which a metal seal member is disposed on the base of a device package and an organic sealant is placed along the outside of the base outside the metal seal member, or in a variation, on top of the metal seal member. The lid or cap of the package is then pressed onto said sealing structure to form a hermetic seal at room temperature. The metal seal member is made of indium which Kyle teaches is slightly deformed by the pressing of the cap. A preferred organic sealant is epoxy which can later be cured to hardness by the application of UV light. The organic sealant serves two purposes. The first is to apply further lateral pressure to the metal seal as the organic sealant shrinks during the curing process. The second is to hold the seal together during the operational lifetime of the package. eq., force retention. Kyle teaches that neither the metal seal nor the organic sealant are sufficient in themselves to provide a durable hermetic seal. The soft indium metal provides only a weak hermetic seal and is unable to hold the package together without the additional holding force of the organic sealant. The organic sealant by itself would outgas contaminants into the package and allow moisture to leak in and would therefore not provide a true hermetic seal.

OBJECTS AND ADVANTAGES OF THE INVENTION

The object of this invention is to provide a means of hermetically sealing a microdevice at room temperature by means of a high aspect ratio solder preform in conjunction with an optional mechanically shaped structure on package cap or base so as to provide a high degree of surface deformation to said preform during pressure sealing.

Another object of the invention is to use cold welding of metals affixed to cap and base, or which are constituent parts of cap and base, to maintain the holding force to keep cap and base together.

A further object of the invention is to form a seal ring of a suitable, high yield strength material, such as copper, tin alloys or gold, on one member of a package cap or base assembly by means of plating or cladding. Such seal ring will form a cold weld gasket material suitable for a hermetic seal.

Another object of the invention is to form axial interconnect structures, for example electrical or optical input and output connections, as part of such seal ring so as to provide axial feed-throughs after the cold weld compression operation.

Another object of the invention is to form knife or shear edge structures on the cap and/or base which will enhance the solder shear forces and surface expansion operative in creating a cold weld between materials which are sheared along those surfaces through pressure applied to join cap and base.

Another object of the invention is to form a cold weld that will have sufficient strength to maintain the force required to keep the package and base hermetically sealed after the compressive force is removed.

Another object of the invention is to provide a means to apply a high electric field at the sealing interface between cap and base so as to induce metal migration of seal materials, thereby enhancing the cold weld and allowing cold welds at lower physical pressures.

Another object and advantage of the invention is to form a hermetic seal at room temperature with such seal exhibiting a leak rate of less than $10^{-9}$ Torr liter/sec.

A specific advantage of the invention is a method of room temperature hermetic sealing of MEMS devices which exhibit sensitivity to heat cycling during the sealing operation.

Another advantage of the invention is very high throughput sealing, since only a single compression step is required to make a hermetic seal. No heat cycling with attendant solder melt or welding dwell times is required.

Another advantage of the invention is its application to microdevices or nano-devices other than MEMS such as NEMS, hybrid assemblies, vacuum microelectronic devices and semiconductor devices which may require a high degree of hermeticity.

BRIEF SUMMARY OF THE INVENTION

The invention disclosed herein provides a structure and method for cold weld compression bonding using a high aspect ratio gasket and/or other mechanical sealing structure to enhance solder surface expansion at room temperature to hermetically seal MEMS and other microdevices.

The invention can be extended to wafer scale packaging of MEMS and other microdevices through the fabrication of suitable structures for cap attachment during the fabrication sequence for the MEMS or microdevices. Packaging structures may be fabricated by plating or etching into the substrate at various stages during device fabrication.

DETAILED DESCRIPTION OF THE INVENTION

Although the following detailed description delineates many specific attributes of the invention and describes specific fabrication procedures, those skilled in the art of microfabrication will realize that many variations and alterations in the fabrication details and the basic structures are possible without departing from the generality of the processes and structures. The most general attributes of the invention relate to a structure and method of making a hermetic seal between a microdevice package base and cap at room temperature. The specific novelty of the invention is found in the use of a mechanical structure on cap or base which increases the surface expansion of a solder preform thereby enabling higher yield strength solder materials to be used in a cold weld package sealing application. Another specific attribute of the invention is the use of a high aspect ratio cross section preform which, together with said mechanical structure further increases the surface expansion of the solder preform enabling a robust cold weld seal to be achieved without the need for additional force retention means. By altering the structure of the cold-weld press mechanism and force maintenance structures, hermetic seals can be executed at a single package level or a wafer scale level.

Figure 1A:
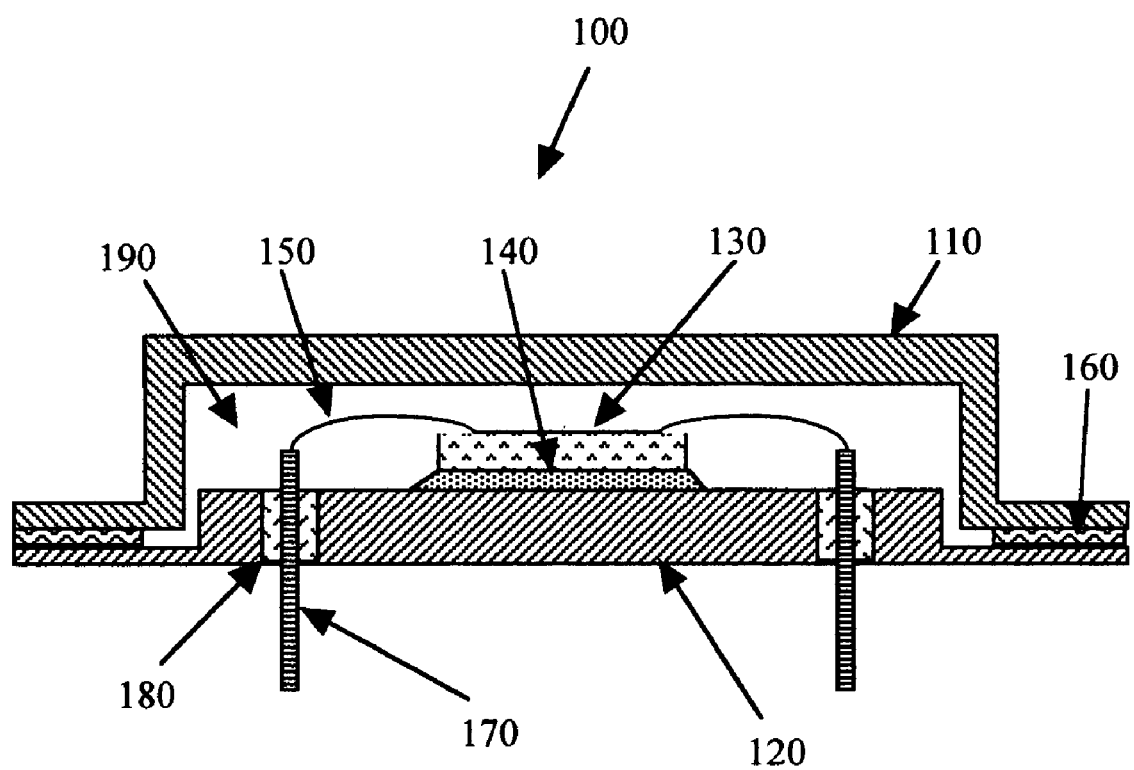
FIG. 1a shows a prior art sealing technology for attaching a package cap to a base by solder sealing means.
Figure 1B:
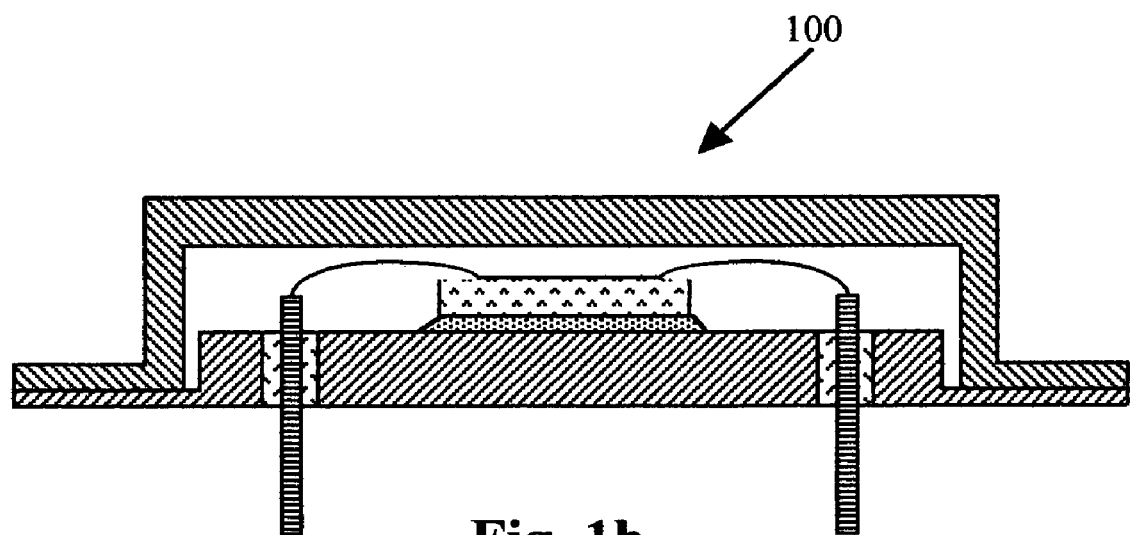
FIG. 1b shows a prior art sealing technology for attaching a package cap to a base by welding means.
Figure 2:
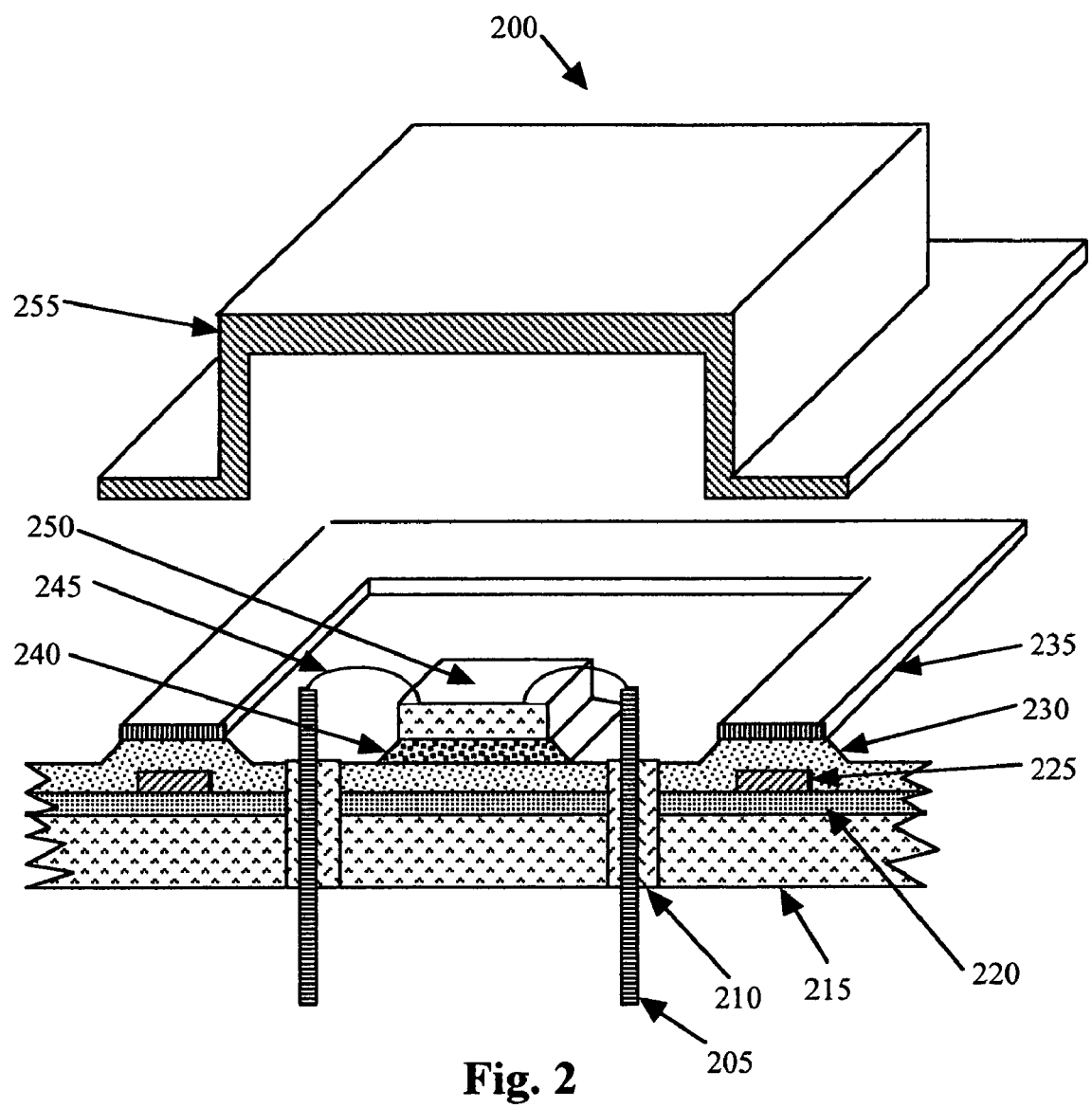
FIG. 2 shows a prior art wafer scale packaging technology utilizing an integral localized heater for performing an individual cap attachment sequentially at each die site on a wafer.
Figure 3:
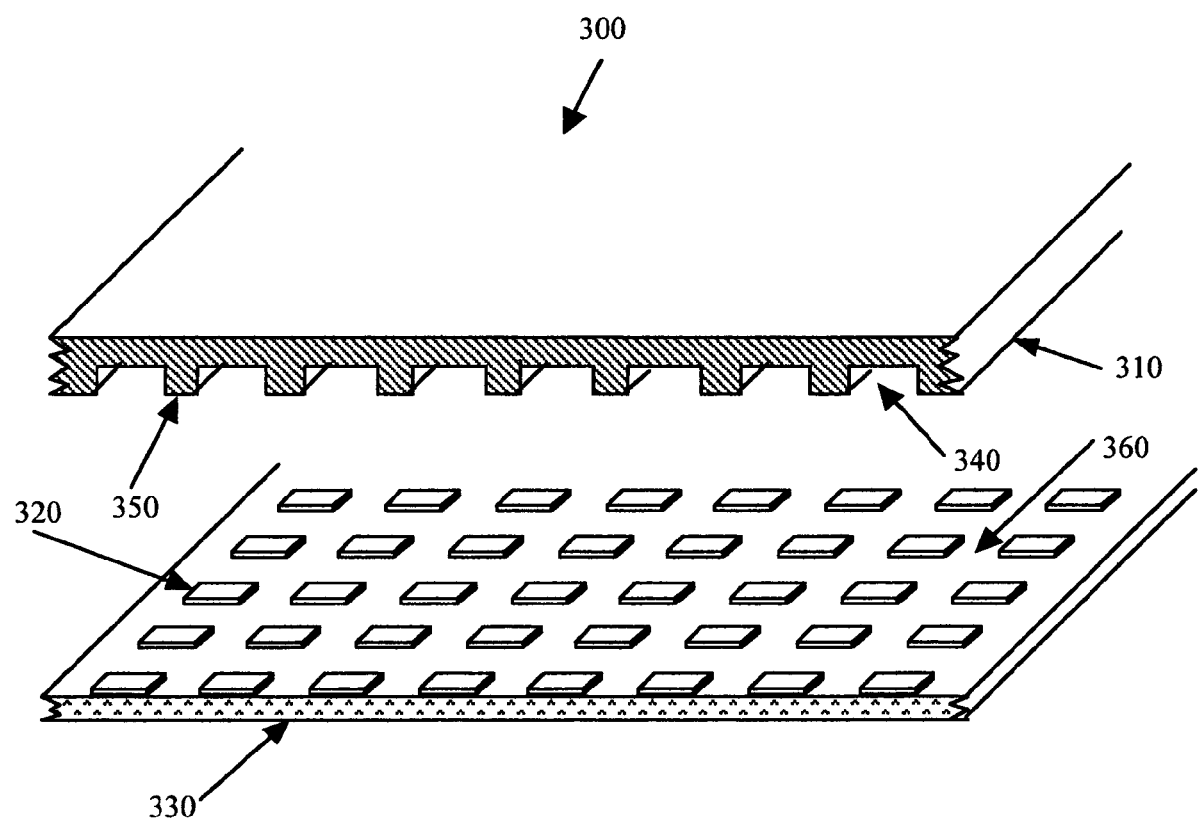
FIG. 3 shows a prior art wafer scale packaging technology where an entire wafer is capped and sealed at once using anodic, fusion, covalent or eutectic bonding.

Extensive prior art in the packaging of microdevices is shown in FIGS. 1, 2 and 3. FIG. 1 delineates a hypothetical MEMS device 130 mounted on package base 120 with electrical feedthrus 170 penetrating the base and insulated from the base by insulator 180. MEMS device 130 is attached to the base 120 using material 140 which may typically be solder or organic adhesive. Wire bonds 150 connect the MEMS device electrically to feedthrus 170. MEMS die 130 may be released from its temporary support either as a singulated die before mounting on the package base or after mounting on the base. The MEMS device may also be tested after mounting on the base in an appropriate environment of rarefied gas or in vacuum. Package cap 110 is conventionally attached using heat soldering with solder preform 160 or can be weld sealed directly cap to base without solder as shown in FIG. 1b. The package base and cap will typically be metal (often kovar) and be plated with a solderable metal in the case of solder sealing. After sealing, the space 190 is hermetic and the atmosphere during sealing is trapped therein and thus constitutes the operational ambient during the life of the device. There are a number of variations on this single package assembly relating to the method of MEMS die attach, configuration of the electrical feedthrus in the base and package profile variation as a function of how the package is attached at the PC board level. All variations are well documented in prior art.

FIG. 2 represent a different prior art approach to MEMS packaging in that caps are applied to the MEMS devices prior to die singulation. The substantial advantage is that MEMS release can be performed on a whole substrate at once rather than one die at a time. In addition, the MEMS die are protected by the cap during singulation that often includes a wet sawing step. Thus, referring to FIG. 2, substrate 215 represent a portion of a large substrate containing many die. The substrate may include electrical feedthrus 205 insulated from the substrate by insulator 210 or may simply (more commonly) be a ceramic substrate with filled, electrically conductive, thru vias with wire bond connections 245 directly connected to the vias. MEMS device 250 is mounted upon base 215 using material 240. In this concept a polysilicon heater (or other conductor material) 225 is deposited in an annular ring around the periphery of the die site (but inside the scribe lines). If the substrate is conductive the heater ring is insulated from the base by insulator 220 and insulated from the cap 255 (if required) by insulator 230. A top solder ring 235 is provided in registration with the heater ring and will form a seal between the metal on the cap and the metal layer (not shown) on the base under the solder. Current is supplied to the resistance heater element 225 from off the substrate through peripheral leads. Thus, a solder seal can be executed by localized heating close to the solder location which minimizes the heat flux in the vicinity of the die.

Another prior art wafer scale packaging technique is shown in FIG. 3. An array of MEMS die 320 can be released from the temporary support at the wafer scale. A portion of a larger array of MEMS die is shown on substrate 330. The die are separated by wide scribe lines 360. An entire matching substrate, a portion of which is shown in FIG. 3, 310 can be bonded to substrate 330 by pressure and electric field application (called anodic or fusion bonding). Covalent or eutectic solder bonding can also be utilized. Cavities 340 formed in the extended cap substrate provide space for the MEMS devices after bonding. However, for the process to function at a high level of yield, the matching substrates must be very flat for intimate contact everywhere and the cap and base material system must be amenable to such a process. Silicon substrates are commonly used with silicon caps. After wafer scale bonding, the die can be singulated by sawing without damage to the active MEMS devices.

Figure 4A:
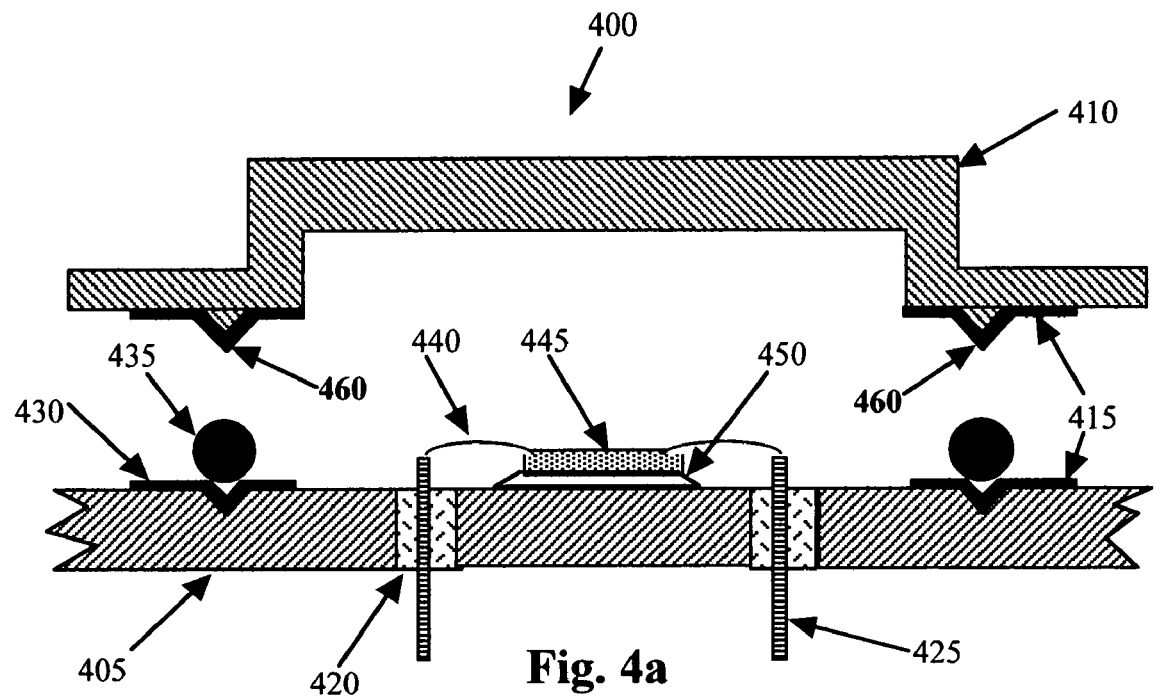
FIGS. 4a and b shows a method of cold weld compression bonding a cap to a package base utilizing a mechanical shearing structure with a high aspect ratio, circular cross section perform to achieve maximum surface expansion of the preform as disclosed in this invention.

The invention described herein utilizes an entirely different approach to hermetic package sealing than prior art. FIGS. 4a and b show in cross section a package cap which may be circular or square from top view and similar to a conventional semiconductor package cap. A matching base is shown below the cap in FIG. 4a and in rough alignment with the cap. Cap and base are prepared separately but are of the same metal material or if of different material the Thermal Coefficient of Expansion (TCE) must be closely matched. An exemplary material for cap and base is the steel alloy Kovar. Stainless steels or other formable but refractory metals can also be used. The cap is formed by stamping or machining. An optional knife or shearing edge may run continuously around the rim of the cap and is intended to enhance the surface expansion and deformability of the cold weld material. The knife or shearing edge may take other mechanical forms and shapes which are intended to optimize the solder preform surface expansion.

The base shown in FIG. 4 may be, for example, a conventional semiconductor type metal base, glass, a ceramic substrate, or the MEMS wafer itself, having insulated electrical via feedthrus with the MEMS die connected to the feedthrus by wire bonding. If the die are attached to a separate base, which offers more latitude for external connections, then the attachment material can be epoxy between the die and package base. The MEMS can be released before or after the die is attached to the package base.

The peripheral area of the base may be plated or clad with a substrate seal metallization layer of, for example, copper, gold or tin alloy, which is sealed hermetically to the base or formed as a precursor gasket. An adhesion metallization layer may be used to strengthen the adhesion of this layer to the base. A bump seal structure, narrower than the metallization layer, may be formed on the substrate seal metallization layer. If axial input/output connections for electrical, optical and other interactions are desired, then they may be formed during or before the substrate metallization, which may be subsequently planarized to ensure an even seal.

The cap shown in FIG. 4 also is provided with a precursor metallization layer which will match the position and shape of the substrate metallization layer. The cap metallization layer is made of any material with which it is possible to form a cold weld with the substrate metallization layer and optional substrate bump seal structure. The precursor metallization layers are however typically of the same composition as the solder preform. The cap can be, for example, metal, glass or ceramic, expansion matched with the base. In the case of optical MEMS, it can have the optical window prepared in the cap frame. If needed, a getter can be built into the cap or flashed onto the cap in a separate chamber.

Referring to the detail in FIG. 4a a package base 405 is shown with MEMS die 445 attached to the base with bonding layer 450. Electrical wire bonds 440 are connected between die 445 and the electrical feedthrus 425. Electrical feedthrus 425 are insulated from the package base 405 by insulators 420 as in conventional prior art. Both cap and base are prepared with metallization 415 and consist of an adhesion layer of chrome followed by a layer of solderable metal. The layers 415 may be deposited by conventional Physical Vapor Deposition (PVD). A final top layer of 415 consists of a deposited layer of the cold weld material of choice, which may be identical with the preform or other gasket of cold weld material 435. Indium and indium alloys have been used but the low yield strength of indium generally requires that auxiliary force retention means be employed to avoid possible accidental separation of cap from base during the life of the package. Other materials such as copper and gold and tin alloys can also be used at higher pressures. The preform or other gasket 435 is shown to have a circular cross section and equivalent high aspect ratio enabling a very high degree of deformation and surface expansion, thus material flow, during the compression bonding step. Other cross sectional profiles are possible where an even greater degree of material flow and surface expansion is possible. Also, structures such as knife edge 460 fabricated into the package cap and base are possible where the design is intended to greatly enhance the metal preform flow and surface expansion.

Figure 4B:
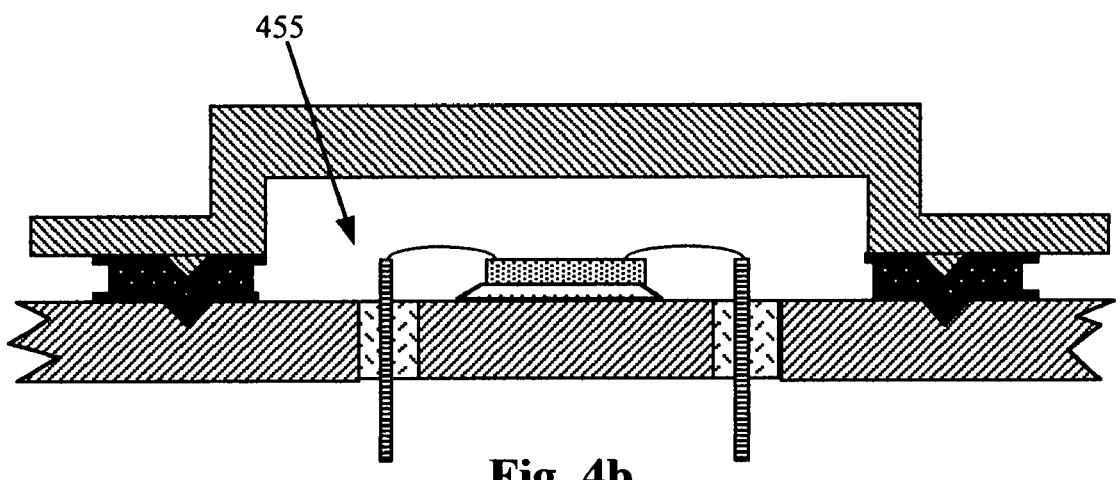

Referring to FIG. 4b the package cap is shown in intimate and hermetic contact with the package base with cold weld preform deformed to a flat washer structure as a result of high pressure from the bonding head. Space 455 now contains the MEMS device hermetically sealed from the outside atmosphere with the prebonding atmosphere trapped within the cavity 455.

Figure 5:
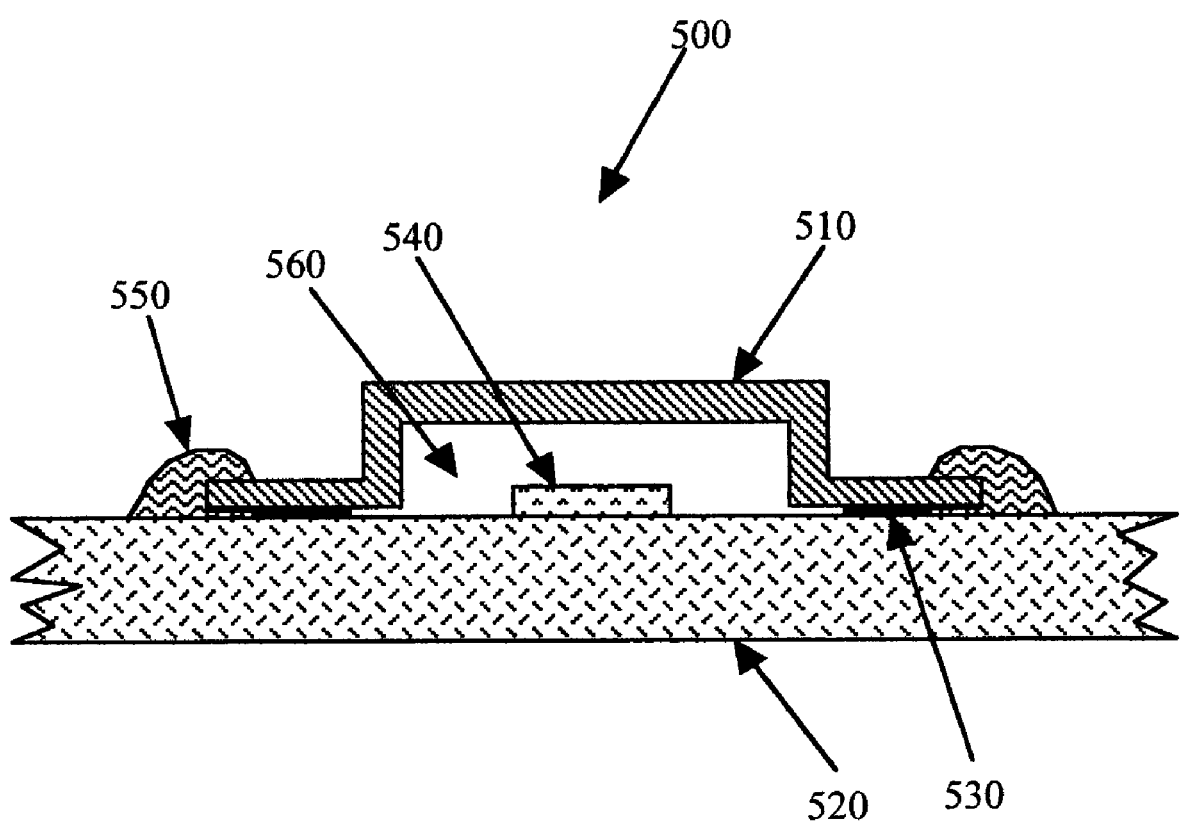
FIG. 5 shows a method of cold weld compression bonding a cap to a package base as disclosed in this invention with an additional mechanical retention means to increase the yield strength between cap and base.

FIG. 5 shows in cross section a MEMS device 540 within a cold weld bonded cap 510 and base 520 sealed by the compressed preform or other gasket 530. In instances where the yield strength of the cold weld material 530 is undesirably low an auxiliary force maintenance material such as epoxy 550 can be applied after the cold weld sealing as disclosed and required by Kyle. The hermetic nature of the cold weld bond prevents the undesirable influx of curing vapor from material 550 from contaminating the MEMS device inside the package Higher melting point (MP) In bearing solders (with for example Pb, Sn or Ag) may also be used for package seal metallization and preform, which will allow the seal to tolerate higher temperatures and provide high enough yield strength between cap and base so as to avoid auxiliary force retention means. These materials may also be plated and thus applied to MEMS devices at the wafer scale using the same processes that are employed in focal plane array technology.

While cold welding pressures as high as 1.5 million PSI have been suggested for copper cold welds, the pressure actually used can be much lower by exploiting the energy generated at the bond interface due to friction and metallic bond breaking when high levels of shear forces are generated. The base and cap may therefore use knife or sliding edges to enhance such shear forces and material surface expansion.

Aluminum, copper, gold and other materials are highly deformable well below their cold weld pressures. The base and cap metallizations can therefore use thin layers of low tensile stress materials applied to weld interfaces as a cold weld bonding aid. Such interface materials may allow the use of aluminum/copper/gold materials on silicon at the wafer scale.

Figure 6A:
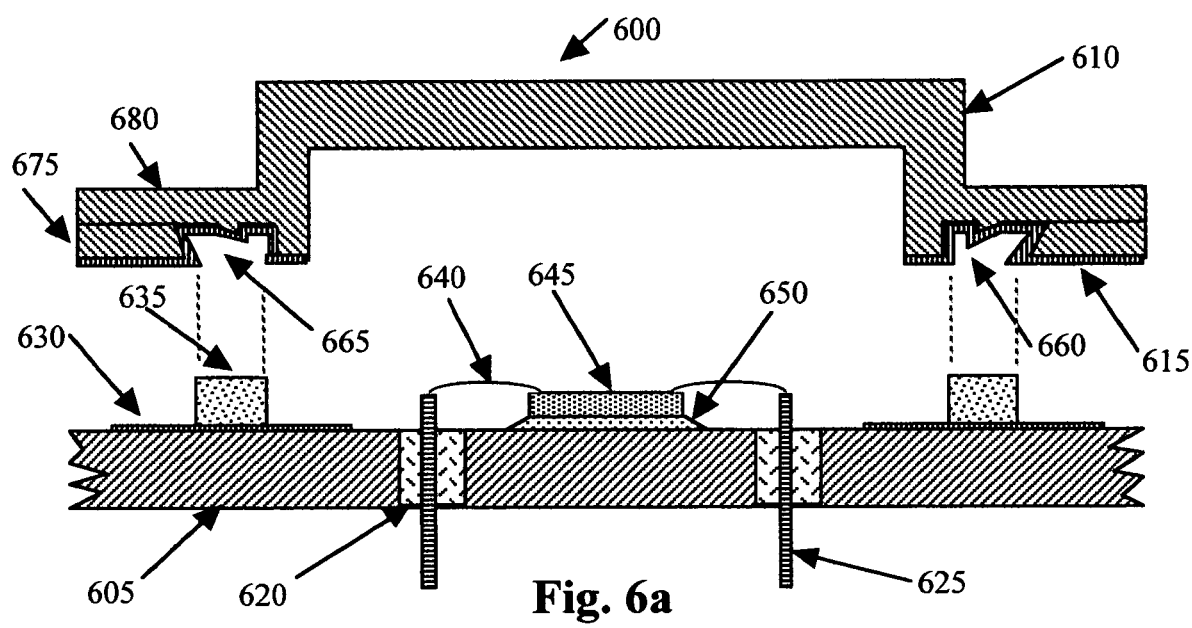
FIG. 6 shows an exemplary mechanical structure for the cold welding compression bonding process executed at the wafer scale.
Figure 6B:
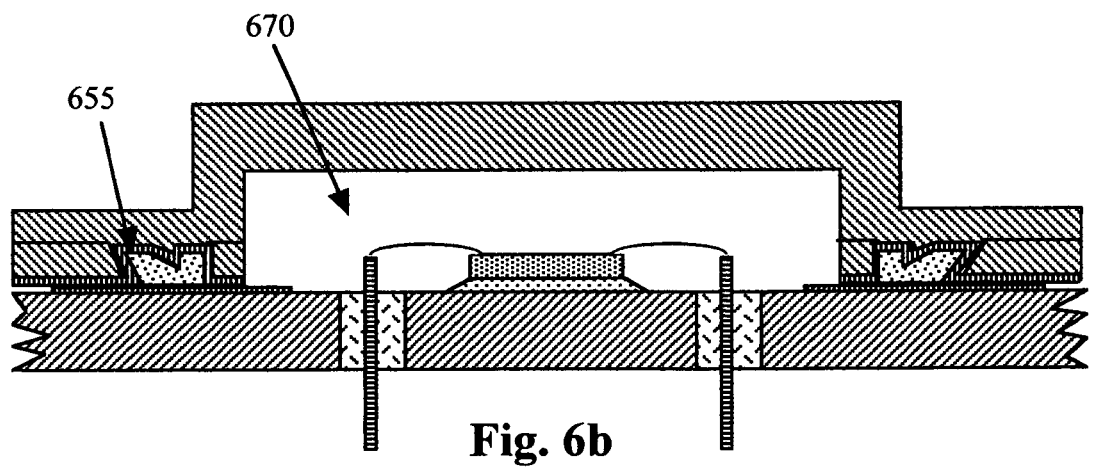
Figure 7:
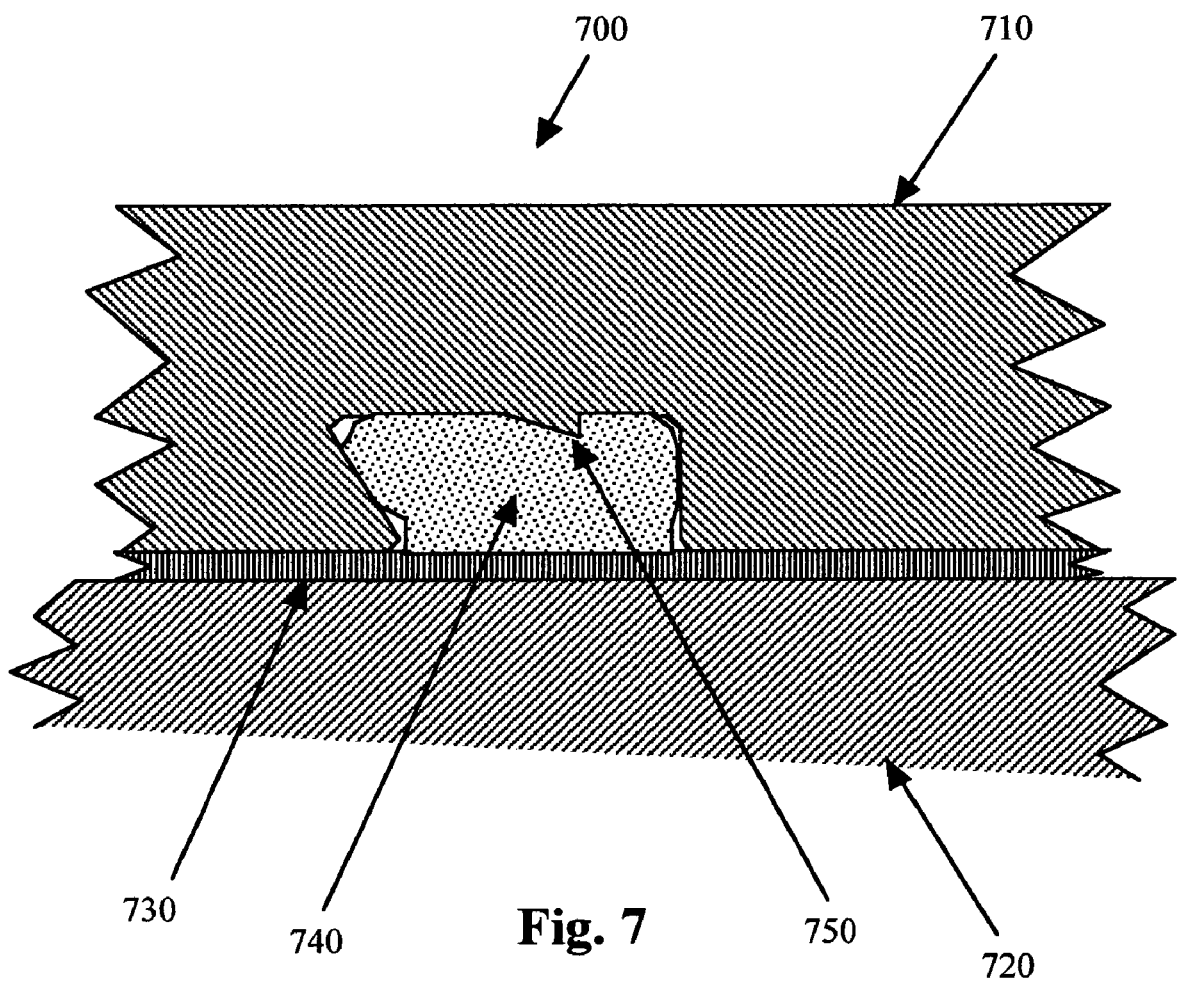
FIG. 7 shows a detail of the preferred re-entrant force retention mechanism as shown in FIG. 6.

Applying caps to arrays of MEMS devices that have been released at the wafer scale is desirable since the individual die can be singulated by cutting between the sealed devices. This avoids any cutting debris from interfering with the mechanical integrity of the microscopic mechanical parts of the active MEMS devices. As an example of wafer-scale sealing, FIG. 6a shows in cross section a package cap 610 and base 605 with MEMS die 645 attached to the base by conventional means. Substrate 605 is part of an extended substrate containing many MEMS devices which have been released at the wafer scale. As part of the fabrication sequence for the MEMS devices 645, layer 630 has been applied to substrate 605 using, for example, Physical Vapor Deposition (PVD). This layer consists of two separate layers applied sequentially. The bottom layer is an adhesion layer of, for example, chrome with thickness of 500 angstroms followed by a tin alloy layer nominally 1 micron thick. A very thick preform-like structure 635 is plated on top of layer 630 and consists of a cold-weldable material such as tin alloy solder. Structure 635 may be from 10 to 50 microns thick. Package cap 610 may be fabricated in two parts. In this case, the primary part 680 is stamped to the desired shape, then an annular ring piece 675 is fabricated and brazed to piece 680 so as to form a substantial re-entrant cavity 665 in that portion of the cap that will accept the cold weld material. In addition, a cold-weld flow structure 660 may be added to cap part 680 to enhance the surface flow and surface expansion of the cold weld material. Layer 615 may be applied to the lower face of the cap assembly by plating and may consists of a nickel strike of about 50 millionths thickness followed by a plating of the cold weld material used on the package base. Exemplarily, the cold-weld material thickness will be 2 to 4 microns and consist of tin alloy solder. Upon bonding the cap to the base as shown in FIG. 6b the cold weld material is forced up into the re-entrant cavity 660 with the excess squeezed out laterally, thus locking the cap to the base. If the yield strength of the cold weld material is sufficiently high, the cap will be adequately secured to the base.

In single-die sealing, cap and base are introduced into a chamber at room temperature where the ambient is maintained at vacuum, rarefied gas or other ambient desired in the final micropackage. The chamber, which may be part of a complex sealing system, is equipped with a high force compression bonder with a die bonding head. Alignment of cap to base may be achieved using an indexing X-Y stage to move the base under the cap. Sufficient force is then applied between cap and base to form a cold weld between the cap and base metallizations and thus seal the device at room temperature. An automated system can gang bond arrays of released MEMS devices sequentially. The technique allows an array of caps to be fabricated that will register with the MEMS device array, negating the need to handle individual package caps.

In wafer-scale sealing, MEMS devices may be released and electrically probed for functionality before introduction to a sealing chamber, or inside a compartment of a sealing chamber. Caps, such as those described above, are prepared as either individual device caps or in a wafer-level cap array in which individual caps have been formed, for example by stamping. The wafer and the caps are introduced into the sealing chamber. The wafer is supported by a firm plate on its under side. Sealing of the caps to the bases is then accomplished as described in the previous paragraph. Caps may be attached in sequence to the individual die on the substrate. They may be held in a bond-head fixture and gang-bonded in sections or all at once.

With either single-die or wafer-scale cold weld compression bonding as disclosed herein, the bonding process may be facilitated, and the necessary pressures thereby lowered, by the application of electrical fields between base and cap structures. Fields of sufficient strength cause metal migration between the base and cap metallization layers.

The present invention is well adapted to carry out the objects and attain the ends and advantages mentioned as well as other inherent therein. While a present embodiment of the invention has been given for the purpose of disclosure, numerous changes or alterations in the details of construction and steps of the method will be readily apparent to those skilled in the art and which are encompassed within the spirit and scope of the invention.

What is claimed is:

1. A structure and method for hermetically sealing a device inside a micro- or nano-package wherein:
   a package base and cap, with a metallic sealing gasket between said base and cap are sealed by compressive force means sufficient to effect a hermetic cold-weld seal without the addition of heat, and
   the sealing is effected with said base, cap, metallic sealing gasket, device and compressive force means inside a sealing system chamber so that the inert, rarified gas or vacuum ambient environment of said chamber is captured inside said sealed package, and
   one or more mechanical structures are provided in the cap, base or gasket that increase metal surface expansion flow of said metallic sealing gasket material thereby enabling higher yield strength solder materials such that a permanent hermetic cold weld can be effected without the need for additional holding force structures or sealants.

2. The structure and method of claim 1, wherein said device is a MEMS or NEMS.

3. The structure and method of claim 1, wherein the metal surface expansion flow enhancement means is the use of said metallic sealing gasket with a height greater than the width of the interface between said metallic sealing gasket and either the package base or cap before the compressive force is applied.

4. The structure and method of claim 3, wherein said metallic sealing gasket is formed of a substantially round wire, of a solder perform higher than it is wide, or by metal plating, cladding or vacuum deposition on either or both of said package base or cap such that said metallic sealing gasket is higher than it is wide.

5. The structure and method of claim 1, wherein a precursor material is provided by vacuum deposition, cladding, plating or other means on both said package cap and base in the area where said cold weld seal is to be accomplished.

6. The structure and method of claim 1, wherein a sharp edge, reentrant cavity or other mechanical design structure is provided in either said package base or cap such that said metal surface expansion flow of said metallic sealing gasket is enhanced as said base and cap are compressed together.

7. The structure and method of claim 1, wherein the metal surface expansion and flow of said metallic sealing gasket is enhanced by moving said package base and cap laterally in relation to each other as they are compressed together.

8. The structure and method of claim 1, wherein said device has been formed on and is integral to said package base or cap.

9. The structure and method of claim 1, wherein a getter is deposited or placed on said package cap or base or said device within said sealing chamber environment and without opening said sealing chamber.

10. The structure and method of claim 1, wherein multiple said devices on a common base substrate are sealed with an array of caps, said caps being either separated or joined together.

* * * * *